United States Patent [19]
Ototake

[11] Patent Number: 5,786,897
[45] Date of Patent: Jul. 28, 1998

[54] METHOD AND DEVICE FOR MEASURING PATTERN COORDINATES OF A PATTERN FORMED ON A PATTERN SURFACE OF A SUBSTRATE

[75] Inventor: Taro Ototake, Tokyo, Japan

[73] Assignee: Nikon Corporation, Tokyo, Japan

[21] Appl. No.: 665,300

[22] Filed: Jun. 17, 1996

[30] Foreign Application Priority Data

Aug. 28, 1995 [JP] Japan .................................. 7-218430

[51] Int. Cl.$^6$ .................................................. G01B 11/00
[52] U.S. Cl. ........................ 356/363; 356/401; 250/548
[58] Field of Search ........................... 356/363, 399, 356/400, 401; 350/401, 548

[56] References Cited

U.S. PATENT DOCUMENTS

| | | | |
|---|---|---|---|
| 4,835,078 | 5/1989 | Harvey et al. | 356/400 |
| 5,523,843 | 6/1996 | Yamane et al. | 356/363 |

*Primary Examiner*—Frank G. Font
*Assistant Examiner*—Robert Kim
*Attorney, Agent, or Firm*—Cushman Darby & Cushman IP Group of Pillsbury Madison & Sutro LLP

[57] ABSTRACT

Pattern coordinates which have been measured on a substrate such as reticle, a mask or the like are also accurately reflected when this reticle is mounted to an exposure device. Thus, measurement deviations are suppressed. In accordance with the present invention, the device for measuring pattern coordinates includes an XY stage for the reticle to be mounted upon and a detection system for measuring the pattern on the reticle. The detection system is arranged under the XY stage and is made up of an objective lens and an optical detection system. The device for measuring pattern coordinates further includes a device for detecting the position of the XY stage comprising X and Y axis interferometers. The reticle is mounted upon the XY stage with its pattern surface facing downwards. This direction is the same orientation as when it is mounted in an exposure device. A laser beam is focused upon the pattern surface from under the XY stage. The pattern upon the reticle is detected by light scattered from the edges of the pattern. This light is detected by the detection system. When the pattern is detected, the position of the XY stage is read out from the X axis and Y axis interferometers.

24 Claims, 10 Drawing Sheets

5,786,897

METHOD AND DEVICE FOR MEASURING PATTERN COORDINATES OF A PATTERN FORMED ON A PATTERN SURFACE OF A SUBSTRATE

BACKGROUND OF THE INVENTION

1. Field of the Invention

The present invention relates to a pattern coordinate measurement method and device for measuring the coordinate position of a pattern which is formed upon the surface of a substrate, such as a reticle, a mask or the like.

2. Description of the Related Arts

FIGS. 9 and 10 show a prior art pattern coordinate measurement device. In FIG. 9, the prior art pattern coordinate measurement device includes an XY stage 11 upon which a reticle 1 is mounted. A detection system 23 measures the pattern coordinates of the reticle 1. Detection system 23 is arranged above the XY stage 11 and has an objective lens 21 and a detection optical system 22. An X axis interferometer 12a and a Y axis interferometer 12b detect the position of the XY stage 11. The XY stage 11 is fixed upon a base (not shown) in the figures, while the detection system 23 is fixed with respect to a frame, also (not shown), which is fixed upon this base. With this type of pattern coordinate measurement device, as shown in FIG. 10, the reticle 1 is mounted upon the XY stage 11 with its pattern surface 1a facing upwards. A laser beam is focused upon the pattern surface 1a, so that the pattern upon the reticle 1 can be detected by the detection system 23 using light which is scattered from the edges of the pattern. Alternatively, another method for performing this pattern detection has also been proposed, in which a CCD camera is used as the detection system, and an image of the pattern is focused upon the image formation surface of this CCD camera so that an image signal which represents this image of the pattern is obtained, and this image signal is then subjected to image processing, so as to detect the pattern upon the reticle 1.

Moreover, the position of the XY stage 11 when the pattern has been detected is read out from the X axis interferometer 12a and the Y axis interferometer 12b. A plurality of pattern coordinates on the reticle 1 can be measured from the pattern information detected by the detection system 23 and the position of the XY stage 11 which has been read out by the interferometers 12a and 12b.

However, with the above described pattern coordinate measurement device, the reticle may bend somewhat due to its own weight when it is mounted upon the XY stage. The pattern surface may become somewhat expanded or contracted due to the influence of the bending. Thus, deviations may occur when measuring the pattern coordinates.

In prior art pattern coordinate measurement devices, the reticle is mounted to the device with its pattern surface facing upwards. By contrast, in quite a number of exposure devices (such as photosteppers), the reticle is mounted with its pattern surface facing downwards. Accordingly, the measurement deviations due to bending when the reticle has been mounted are different for the pattern coordinate measurement device and for the exposure device. For this reason, the problem has occurred that it is not possible to accurately measure the pattern coordinates of the reticle when it has been mounted upon the exposure device, i.e. when the reticle is being exposed.

SUMMARY OF THE INVENTION

The objective of the present invention is to provide a pattern coordinate measurement method and device which can minimize the deviations in measurement of the pattern coordinates during coordinate measurement and during exposure. This is accomplished by facing a pattern surface of a substrate, reticle or the like in the same direction with respect to the perpendicular when measuring its pattern coordinates as when it is mounted to the exposure device.

In order to attain this objective, according to its most general method aspect, the present invention provides a method for measuring coordinates of a pattern formed on a pattern surface of a substrate is mounted on a mounting stage, including steps of: mounting said substrate on said mounting stage with said pattern surface facing downwards; detecting said pattern by a pattern detection device; and measuring the coordinate of said pattern on the basis of a result of detecting of said pattern.

In particular, in the method described above, the mounting stage may be an XY stage. The pattern may be detected from the side of the pattern surface by the pattern detection device which is arranged under the XY stage. The coordinates of the pattern may be measured by detecting the position of the XY stage when the pattern is detected.

Alternatively, the pattern detection device may be arranged upon an XY stage which is arranged under the mounting stage. The pattern may be detected from the side of the pattern surface by the pattern detection device. The coordinates of the pattern may be measured by detecting the position of the XY stage when this pattern is detected.

According to an alternative method, the present invention provides a method for pattern coordinate measurement, including the step of mounting a substrate with a pattern surface upon an X stage with the pattern surface facing downwards. This method involves detecting the pattern from the side of the pattern surface by a pattern detection device. The pattern detection device is provided upon a Y stage which is arranged under the X stage. The method further includes measuring the coordinates of the pattern by detecting the positions of the X and Y stages when the pattern is detected by the pattern detection device.

According to yet another alternative method, the present invention provides a method for pattern coordinate measurement, including the steps of mounting a transparent substrate with a pattern surface mounted upon an XY stage with the pattern surface facing downwards. This method involves detecting the pattern from another surface of the substrate opposite to the side of the pattern surface by a pattern detection device. The pattern detection device is arranged above the XY stage. The method further includes measuring the coordinates of the pattern by detecting the position of the XY stage when the pattern is detected by the pattern detection device.

In this case, the length of the equivalent optical path between the pattern surface of the substrate and the pattern detection device may be compensated by a compensation optical system. Optionally, the compensation optical system may comprise a compensation element which compensates for the aberration of the substrate according to the thickness of the substrate.

The present invention also provides a method for measuring the coordinates of a pattern formed on a pattern surface of a substrate which is mounted on a mounting stage. This method includes the steps of: mounting said substrate on said mounting stage with said pattern surface facing in the same direction as when it is mounted on an exposure device and detecting said pattern by a pattern detection device. The method further involves measuring the coordinates of the pattern based on the results of the pattern detection.

In order to attain the above described objective, the present invention provides, a device for pattern coordinate measurement. This device includes: an XY stage on which a transparent substrate, such as a reticle, a mask or the like with a pattern surface is mounted with the pattern surface facing downwards. A pattern detection device is arranged under the XY stage, and detects the pattern from the side of the pattern surface. A position detection device detects the position of the XY stage. The coordinates of the pattern are measured by detecting the position of the XY stage by the position detection device when the pattern is detected by the pattern detection device.

The present invention provides an alternative device for pattern coordinate measurement. This device includes a mounting stage on which a transparent substrate with a pattern surface is mounted with the pattern surface facing downwards. An XY stage which is provided under the mounting stage; a pattern detection device is arranged upon the XY stage, and detects the pattern from the side of the pattern surface; and a position detection device which detects the position of the XY stage. The coordinates of the pattern are measured by detecting the position of the XY stage by the position detection device when the pattern is detected by the pattern detection device.

Moreover, the present invention provides another alternative device for measuring pattern coordinates. This device includes an XY stage on which a transparent substrate with a pattern surface is mounted with the pattern surface facing downwards. A pattern detection device is arranged above the XY stage, and detects the pattern from the side of the substrate which is opposite to the side of the pattern surface. A position detection device detects the position of the XY stage. A compensation optical system is arranged between the XY stage and the pattern detection device. The compensation optical system performs compensation so as to make the length of the optical path from the pattern surface to the pattern detection device become substantially equal. This compensation is made independently of the thickness of the substrate. The coordinates of the pattern are measured by detecting the position of the XY stage by the position detection device when the pattern is detected by the pattern detection device.

In this case, the compensation optical system may comprise a compensation element which compensates for the aberration of the substrate according to the thickness of the substrate.

In order to attain the above described objective, the present invention provides another device for pattern coordinate measurement. This device includes an XY stage on which a transparent substrate with pattern surface is mounted. The orientation of the transparent substrate is the same as the orientation thereof when it is mounted to an exposure device. A pattern detection means is arranged under the XY stage, and detects the pattern from the side of the pattern surface. A position detection device detects the position of the XY stage. The coordinates of the pattern are measured by detecting the position of the XY stage by the position detection device when the pattern is detected by the pattern detection device.

According to the present invention, since the substrate is mounted to the mounting stage with its pattern surface facing downwards, the orientation of the substrate with respect to the vertical at this time is the same as its orientation when it is mounted to an exposure device to be exposed. For this reason, the values of the pattern coordinates which are measured accurately reflect the values of the pattern coordinates when the substrate is mounted to an exposure device. Accordingly, it becomes possible to accurately measure deviations in superposition when the pattern is mounted to an exposure device. Further, it is possible in the present invention to compensate for the length of the optical path when performing pattern detection provided that the detected substrate with the pattern surface is transparent. Accordingly, it is possible to position the pattern detection device above the substrate without the concerns of how this positioning may influence the accuracy of pattern coordinate measurement.

DESCRIPTION OF THE PREFERRED EMBODIMENTS

The preferred embodiments of the present invention will now be explained with reference to the figures.

Preferred Embodiment 1

Figure 1:
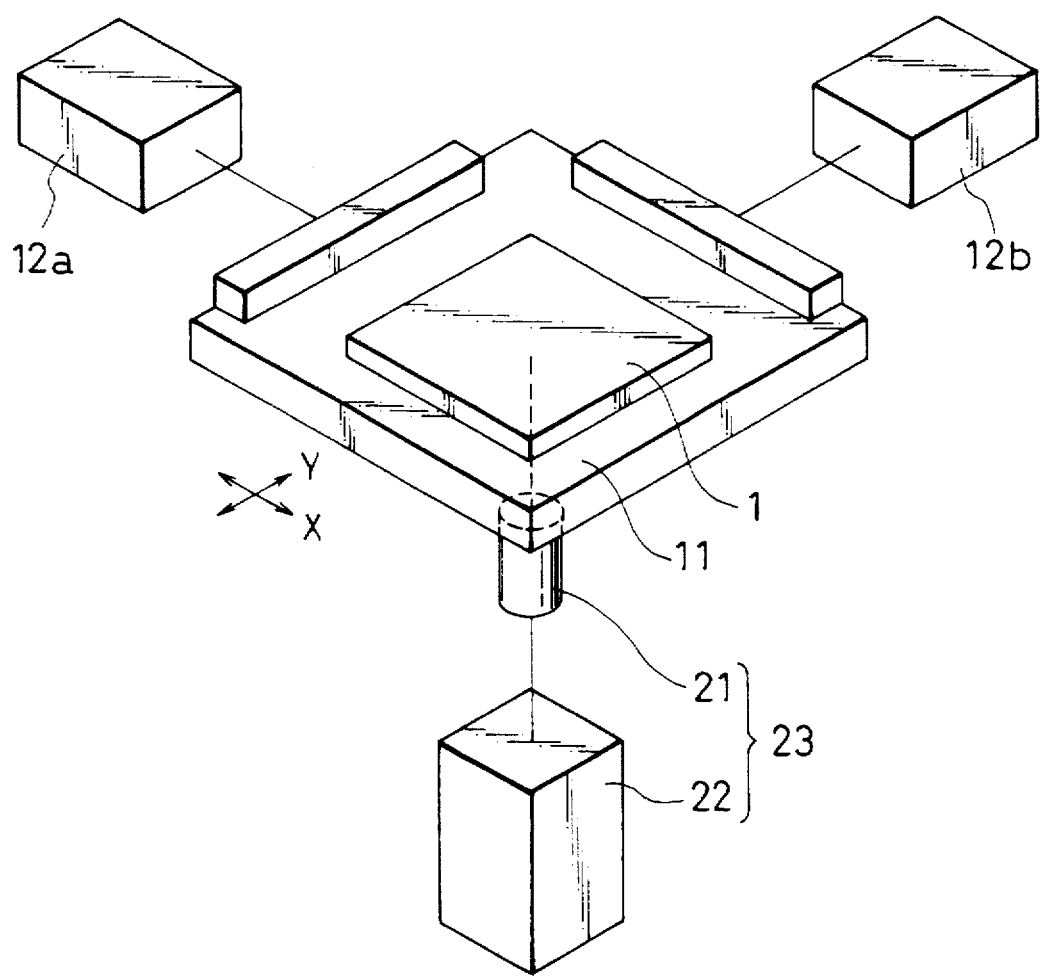
FIG. 1 shows a perspective view of a first preferred embodiment of the pattern coordinate measurement device according to the present invention.
Figure 2:
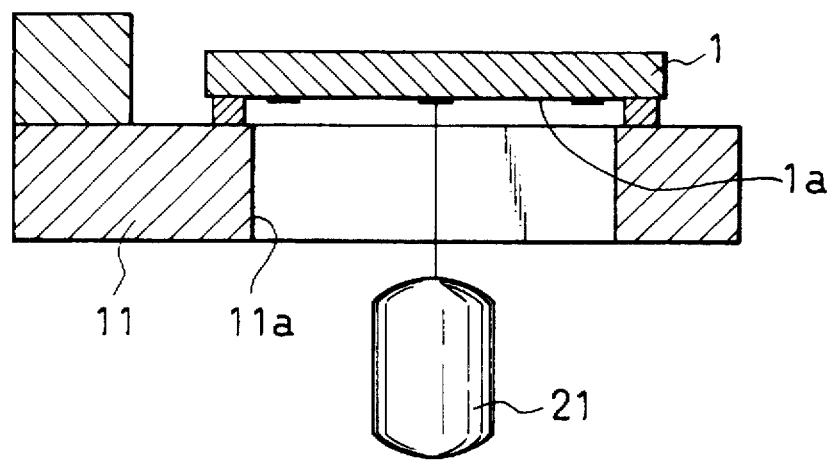
FIG. 2 shows a sectional view of a portion of this first preferred embodiment of the pattern coordinate measurement device according to the present invention shown in FIG. 1.

FIG. 1 shows a perspective view of the first preferred embodiment of the pattern coordinate measurement device according to the present invention. This device implements the first preferred embodiment of the pattern coordinate measurement method according to the present invention. FIG. 2 shows a sectional view of a portion of the first preferred embodiment pattern coordinate measurement device of FIG. 1. In FIG. 1, the first preferred embodiment of the pattern coordinate measurement device includes an XY stage 11 upon which a reticle 1 is mounted. A detection system 23 for detecting the pattern on the reticle 1 is arranged underneath the XY stage 11. The detection system 23 has an objective lens 21 and a detection optical system 22. An X axis interferometer 12a and a Y axis interferometer 12b detects the position of the XY stage 11. The detection system 23 is fixed upon a base (not shown). The XY stage 11 is fixed with respect to a frame, also not shown in the figures, which is fixed upon this base. An opening portion 11a is formed in the approximate central portion of the XY stage 11, as shown in FIG. 2.

With this type of pattern coordinate measurement device, the reticle 1 is mounted upon the XY stage 11 with its pattern surface 1a facing in the downward direction as shown in FIG. 2. This direction is the same mounting orientation for the reticle 1 as when it is mounted to an exposure device (such as a photostepper). That is, the reticle 1 is mounted so that its pattern surface 1a is facing in the downward direction with respect to the perpendicular. The laser beam is directed in the upwards direction and is focused upon the pattern surface 1a from the underside of the XY stage 11. The pattern upon the reticle 1 is detected by the detection system 23 using light scattered from the edges of this pattern.

The position of the XY stage 11 when this pattern has been detected is read out from the X axis interferometer 12a and the Y axis interferometer 12b. Accordingly, it is possible to measure a plurality of pattern coordinates upon the reticle 1 from the pattern information by the detection system 23 and position of the XY stage 11 read out by the interferometers 12a and 12b.

In the pattern coordinate measurement method according to the first preferred embodiment of the present invention, the pattern coordinates upon the reticle 1 are measured with the pattern surface 1a of the reticle 1 being oriented so as to face in the downwards direction. This direction is the same orientation of the reticle 1 as when it is mounted to an exposure device. Therefore, the measured values of the coordinates of the pattern agree accurately with the values of these pattern coordinates when the reticle 1 is mounted to an exposure device. Accordingly, it is possible to perform measurements which can be accurately superposed upon the reticle 1 when it is mounted in an exposure device.

Preferred Embodiment 2

Figure 3:
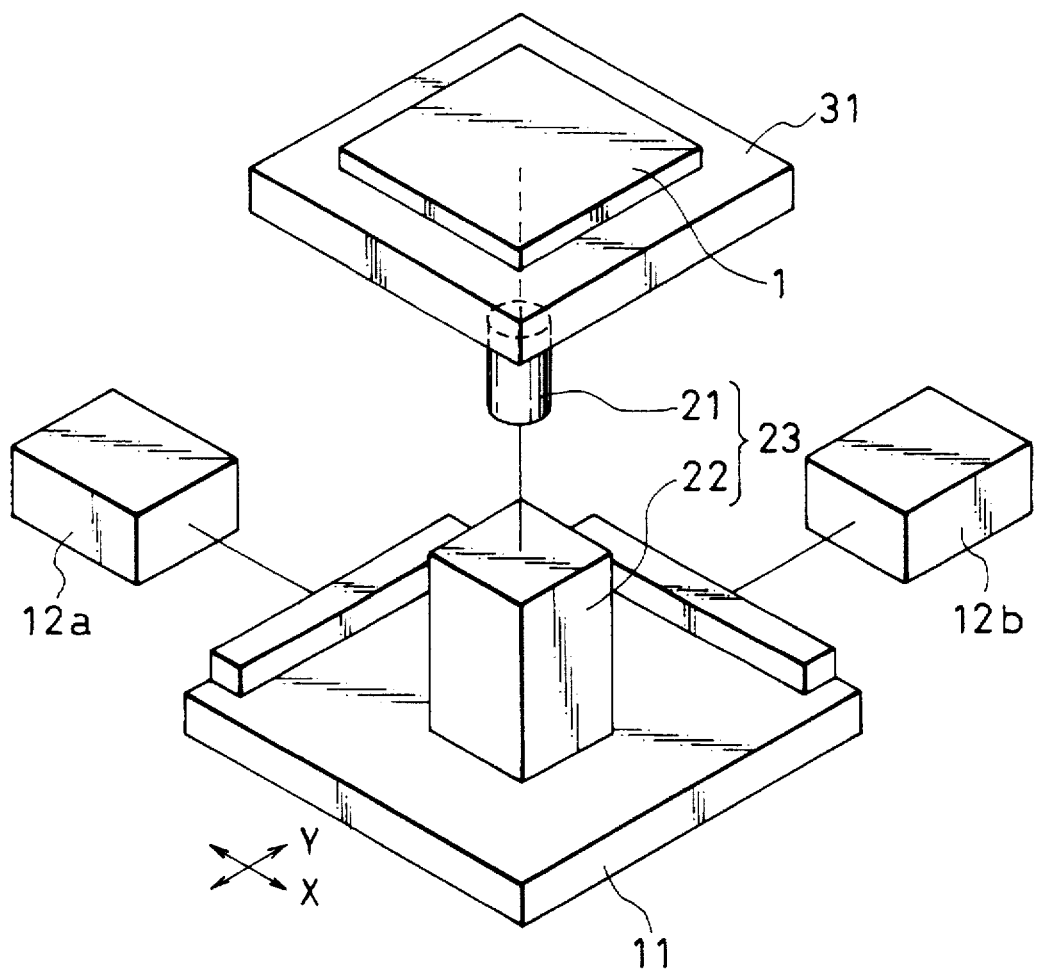
FIG. 3 shows a perspective view of a second preferred embodiment of the pattern coordinate measurement device according to the present invention.
Figure 4:
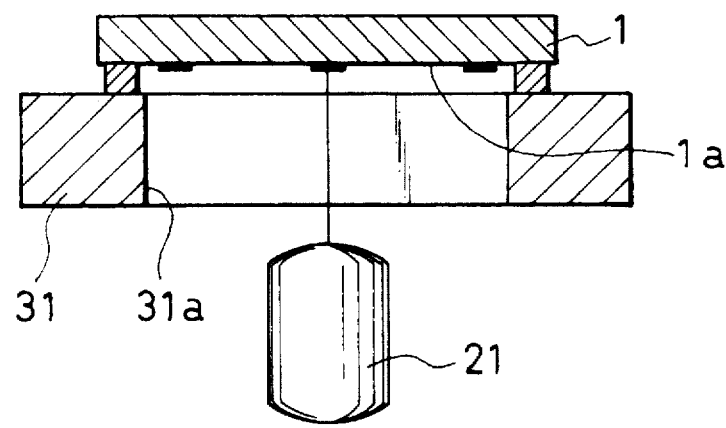
FIG. 4 shows a sectional view of a portion of this second preferred embodiment of the pattern coordinate measurement device according to the present invention shown in FIG. 3.

FIG. 3 shows a perspective view of the second preferred embodiment of the pattern coordinate measurement device according to the present invention. This device implements the second preferred embodiment of the pattern coordinate measurement method according to the present invention. FIG. 4 shows a sectional view of a portion of the second preferred embodiment pattern coordinate measurement device of FIG. 3.

In FIG. 3, the second preferred embodiment of the pattern coordinate measurement device includes a holder 31 upon which a reticle 1 is mounted. A detection system 23 for detecting the pattern on the reticle 1 is arranged underneath the holder 31. The detection system 23 has an objective lens 21 and a detection optical system 22. An XY stage 11 is fixed to the detection system 23. An X axis interferometer 12a and a Y axis interferometer 12b detects the position of the XY stage 11. The XY stage 11 is fixed upon a base (not shown). The holder 31 is fixed with respect to a frame, (not shown), which is fixed upon this base. An opening portion 31a is approximately formed in the central portion of the holder 31, as shown in FIG. 4.

With this type of pattern coordinate measurement device, the reticle 1 is mounted upon the holder 31 with its pattern surface 1a facing in the downward direction as shown in FIG. 4. This direction is the same mounting orientation for the reticle 1 as when it is mounted to an exposure device. The laser beam is directed in the upwards direction and is focused upon the pattern surface 1a from the underside of the XY stage 11. The pattern upon the reticle 1 is detected by the detection system 23 using light scattered from the edges of this pattern.

The position of the XY stage 11 when this pattern has been detected is read out from the X axis interferometer 12a and the Y axis interferometer 12b. Accordingly, it is possible to measure a plurality of pattern coordinates upon the reticle 1 from the pattern information detected by the detection system 23 and from the position of the XY axis stage 11 read out by the interferometers 12a and 12b.

Preferred Embodiment 3

Figure 5:
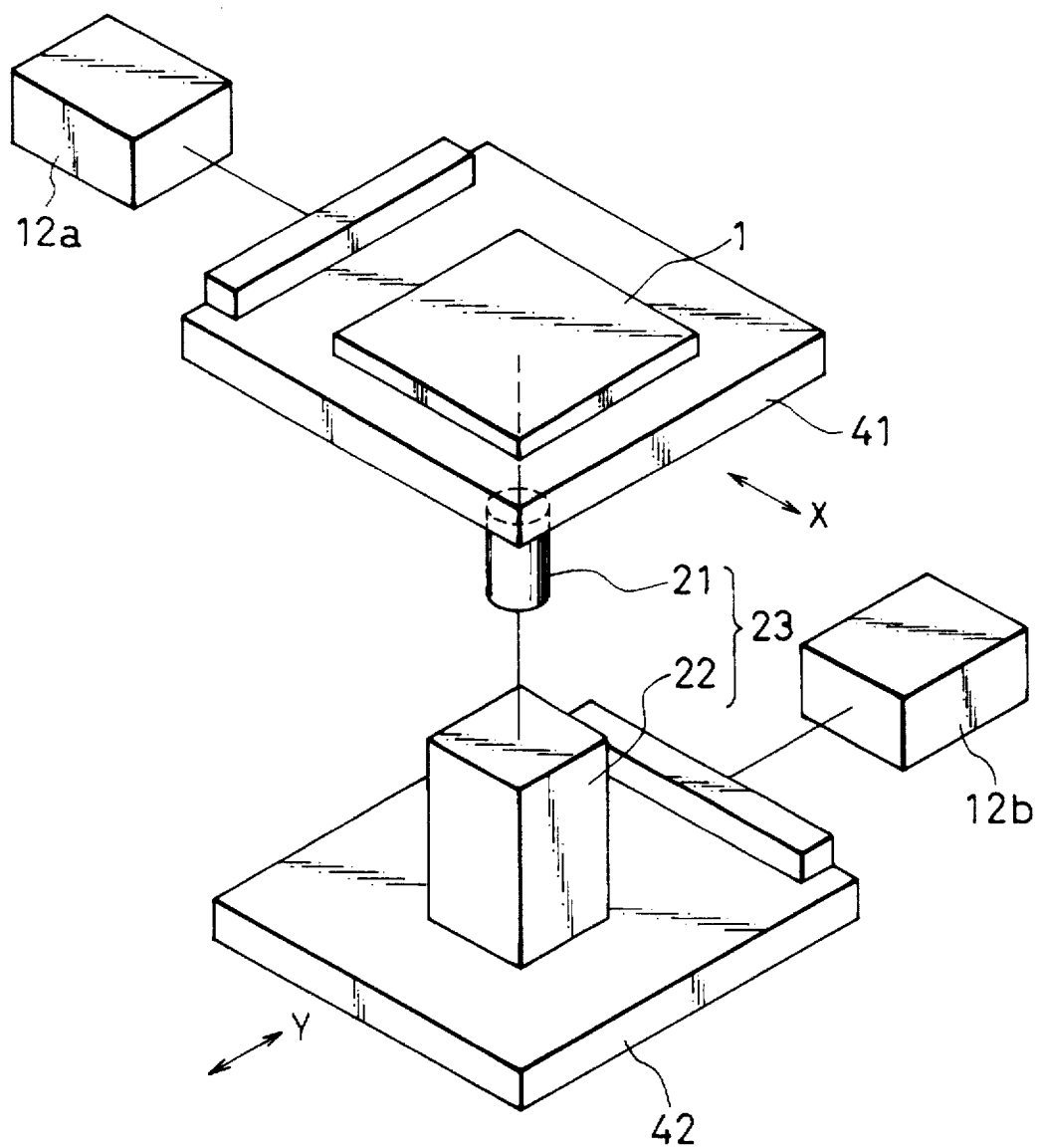
FIG. 5 shows a perspective view of a third preferred embodiment of the pattern coordinate measurement device according to the present invention.
Figure 6:
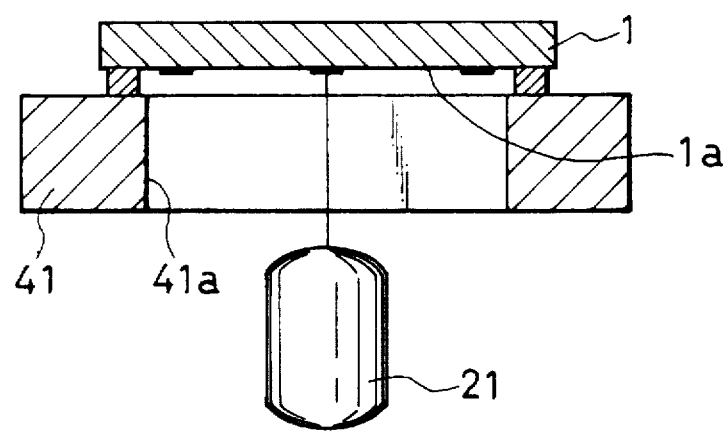
FIG. 6 shows a sectional view of a portion of this third preferred embodiment of the pattern coordinate measurement device according to the present invention shown in FIG. 5.

FIG. 5 shows a perspective view of the third preferred embodiment of the pattern coordinate measurement device according to the present invention. This device implements the third preferred embodiment of the pattern coordinate measurement method according to the present invention. FIG. 6 shows a sectional view of a portion of this third preferred embodiment pattern coordinate measurement device of FIG. 5.

In FIG. 5, the third preferred embodiment of the pattern coordinate measurement device includes an X axis stage 41 upon which a reticle 1 is mounted. A detection system 23 for detecting the pattern on the reticle 1, is arranged underneath the X axis stage 41, and has an objective lens 21 and a detection optical system 22. A Y axis stage 42 is fixed to the detection system 23. An X axis interferometer 12a detects the position of the X axis stage 41, and a Y axis interferometer 12b detects the position of the Y axis stage 42. The Y axis stage 42 is fixed upon a base (not shown). The X axis stage 41 is fixed with respect to a frame (not shown), which is fixed upon this base. An opening portion 41a is approximately formed in the central portion of the X axis stage 41, as shown in FIG. 6.

With this type of pattern coordinate measurement device, the reticle 1 is mounted upon the X axis stage 41 with its pattern surface 1a facing in the downward direction as shown in FIG. 6. This direction is the same mounting orientation for the reticle 1 as when it is mounted to an exposure device. The laser beam is directed in the upwards direction and is focused upon the pattern surface 1a from the underside of the X axis stage 41. The pattern upon the reticle 1 is detected by the detection system 23 using light scattered from the edges of this pattern.

When this pattern has been detected, the position of the X axis stage 41 is read out from the X axis interferometer 12a, while the position of the Y axis stage 42 is read out from the Y axis interferometer 12b. Accordingly, it is possible to measure a plurality of pattern coordinates upon the reticle 1 from the pattern information detected by the detection system 23 and the positions of the X axis stage 41 and of the Y axis stage 42 read out by the interferometers 12a and 12b.

Although in the description of the third preferred embodiment it was assumed that the reticle 1 was mounted to the X axis stage 41, while the detection system 23 was fixed to the Y axis stage 42, it would be possible for the roles of the X axis stage 41 and the Y axis stage 42 to be reversed so that the Y axis stage was the one which was on top. In such a case, the detection system 23 would be fixed to the X axis stage 41 while the reticle 1 would be mounted to the Y axis stage 42.

Preferred Embodiment 4

Figure 7:
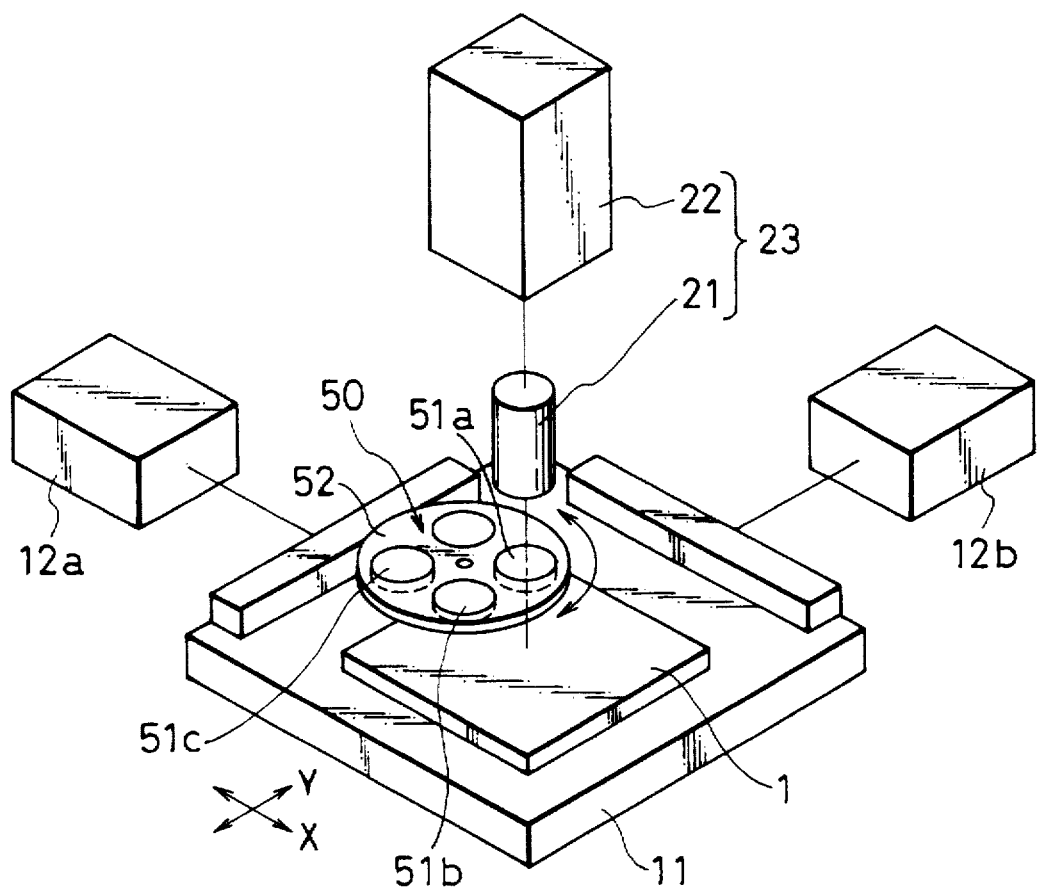
FIG. 7 shows a perspective view of a fourth preferred embodiment of the pattern coordinate measurement device according to the present invention.
Figure 8:
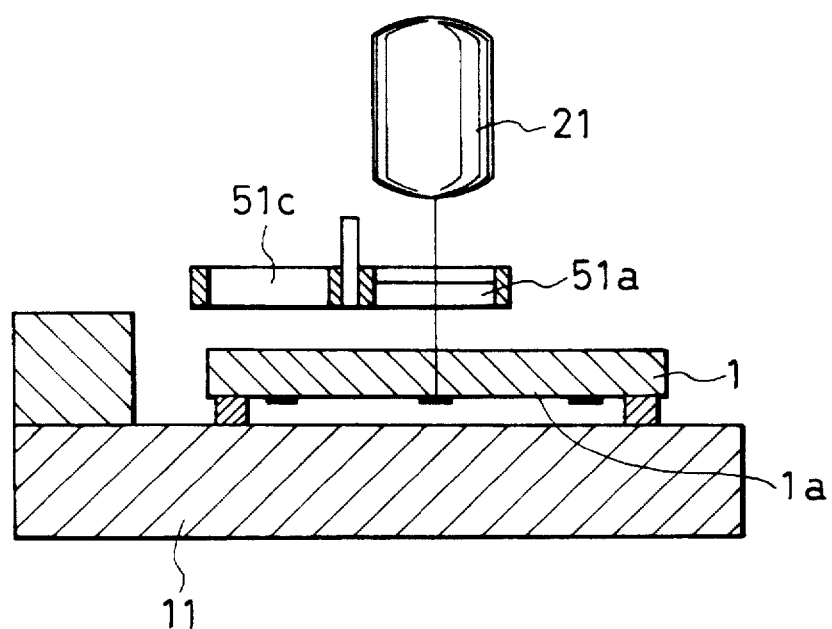
FIG. 8 shows a sectional view of a portion of this fourth preferred embodiment of the pattern coordinate measurement device according to the present invention shown in FIG. 7.
Figure 9:
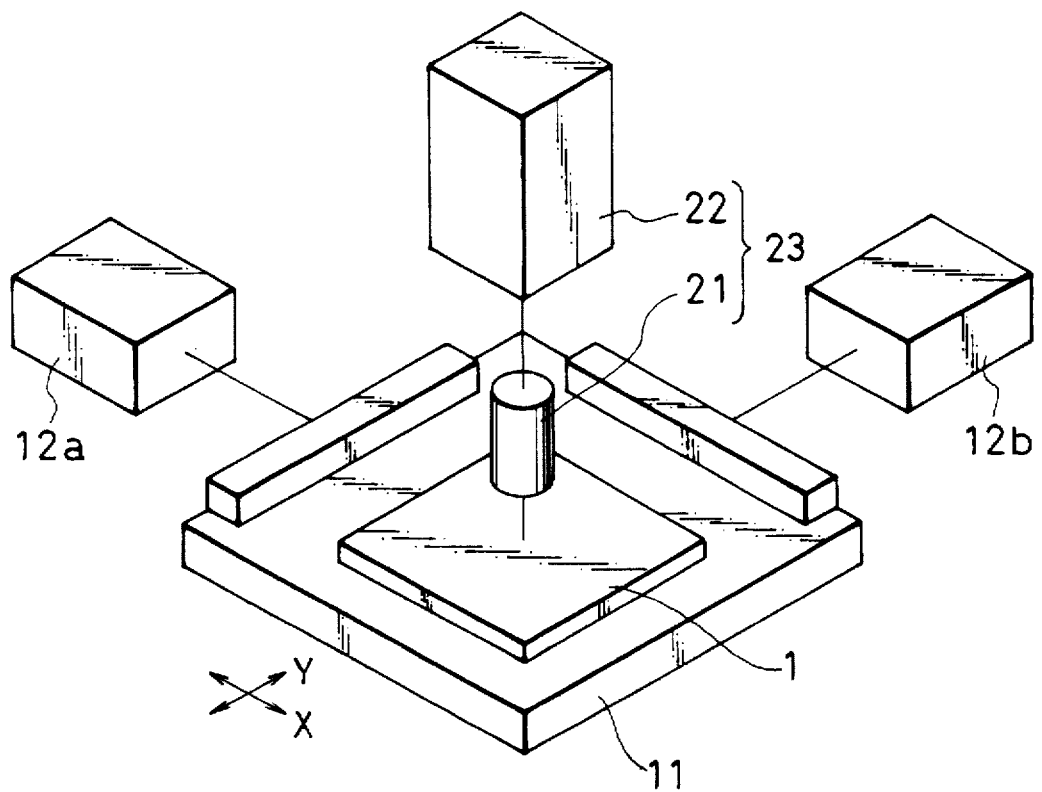
FIG. 9 shows a perspective view of a prior art pattern coordinate measurement device.
Figure 10:
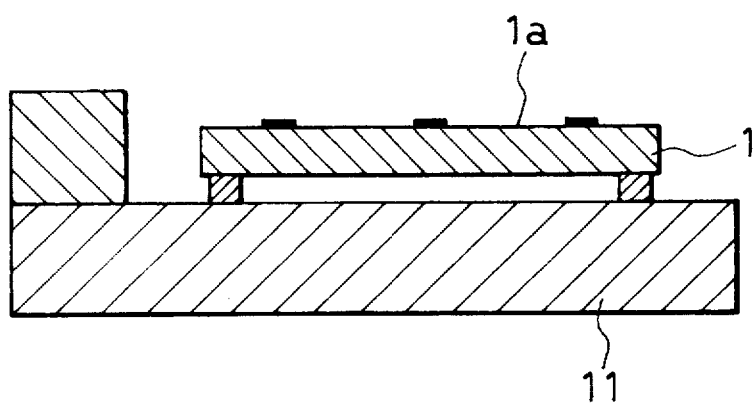
FIG. 10 shows a sectional view of a portion of this prior art pattern coordinate measurement device pattern coordinate measurement device.

FIG. 7 shows a perspective view of the fourth preferred embodiment of the pattern coordinate measurement device according to the present invention. This device implements the fourth preferred embodiment of the pattern coordinate measurement method according to the present invention. FIG. 8 shows a sectional view of a portion of the fourth preferred embodiment pattern coordinate measurement device of FIG. 7.

In FIG. 7, the fourth preferred embodiment of the pattern coordinate measurement device includes an XY stage 11 upon which a reticle 1 is mounted. A detection system 23 for detecting the pattern on the reticle 1 is arranged above the XY stage 11, and has an objective lens 21 and a detection optical system 22. An X axis interferometer 12a and a Y axis interferometer 12b detect the position of the XY stage 11. The pattern coordinate measurement device further includes a compensation glass insertion device 50. The XY stage 11 is fixed upon a base (not shown). The detection system 23 is fixed with respect to a frame (not shown), which is fixed upon this base.

It is assumed that a transparent material such as quartz or the like is used as the substrate of the reticle 1. Accordingly, pattern detection for the reticle 1 can be performed optically through this transparent substrate of the reticle 1. On the other hand, different types of reticles exist which have various different thicknesses, normally from about 0.09 inch (2.29 mm) to 0.25 inch (6.35 mm). Accordingly, the equivalent length of the optical path varies according to the thickness of the reticle 1, and aberrations arise. Therefore, a compensation glass is inserted into the optical path of the objective lens 21 by the use of the compensation glass insertion device 50. Thus, the compensation glass compensates for these aberrations.

In the fourth preferred embodiment of the present invention, in order to respond to variations in the thickness of the reticle 1, a circular plate 52 can be rotated by a motor, (not shown). The plate 52 is provided in the compensation glass insertion device 50, and carries three compensation glass plate elements 51a, 51b, and 51c which have three different thicknesses.

The thicknesses of these three glass plate elements 51a, 51b, and 51c are designed to provide correction of the optical path. For example, if the detection system is designed, using no compensation glass, for the pattern of a quartz reticle 1 having a 0.25 inch thickness inch, then a quartz compensation glass having a 0.16 inch (4.06 mm) thickness will be suitable when detecting the pattern of a quartz reticle having a thickness 0.09 inch to provide an optical path through the quartz of the same equivalent length.

With this type of pattern coordinate measurement device, the reticle 1 is mounted upon the XY stage 11 with its pattern surface 1a facing in the downward direction as shown in FIG. 8. This direction is the same mounting orientation for the reticle 1 as when it is mounted to an exposure device. The laser beam is directed in the downwards direction and is focused upon the pattern surface 1a from above the XY stage 11. The pattern upon the reticle 1 is detected by the detection system 23 which detects light scattered from the edges of this pattern.

While the pattern upon the reticle 1 is being detected, the circular plate 52 is rotated to a position corresponding to the thickness of the substrate of the reticle 1. Thus, so that an appropriate one of the three compensation glass plate elements 51a, 51b, and 51c is inserted into the optical path of the objective lens 21.

The position of the XY stage 11 when this pattern has been detected is read out from the X axis interferometer 12a and the Y axis interferometer 12b. Accordingly, it is possible to measure a plurality of pattern coordinates upon the reticle 1 from the pattern information detected by the detection system 23 and position of the XY stage 11 read out by the interferometers 12a and 12b.

Although only three compensation glass plate elements 51a, 51b, and 51c were used in the pattern coordinate measurement device of the fourth preferred embodiment, it is possible to increase the number of compensation glass plates in accordance with the number of different thicknesses of reticles 1 for which pattern coordinate measurement may be required.

In the preferred embodiments of the pattern coordinate measurement method and device, the pattern upon the reticle 1 was detected by the laser beam being focused upon the pattern surface 1a and the detection system 23 detecting light scattered from the edges of the pattern. However, this is not to be considered as an absolute limitation of the present invention. It would also be acceptable for a CCD camera to be used as the detection system. The image of the pattern can be focused upon the image formation surface of this CCD camera in order to obtain an image signal which represents this image of the pattern. This image signal can then be subjected to image processing in order to detect the pattern upon the reticle. Any other method of detecting the pattern would also be acceptable within the confines of the inventive concept of the present invention. Accordingly, although the present invention has been shown and described in terms of several preferred embodiments thereof, it is not to be considered as limited by any of the details of the embodiments or of the drawings. Various modifications may be made by those skilled in the art without departing from the spirit of and scope of the following claims.

I claim:

1. A method for measuring coordinate of a pattern formed on a pattern surface of a substrate which is mounted on a mounting stage, comprising steps of:

mounting said substrate on said mounting stage with said pattern surface facing downwards;

detecting said pattern by a pattern detection device; and measuring the coordinate of said pattern on the basis of a result of detecting of said pattern.

2. A method for pattern coordinate measurement according to claim 1, wherein said mounting stage is an XY stage, said pattern is detected from the side of said pattern surface by said pattern detection device which is arranged under said XY stage, and the coordinates of said pattern are measured by detecting the position of said XY stage when this pattern is detected.

3. A method for pattern coordinate measurement according to claim 1, wherein said pattern detection device is arranged upon an XY stage which is arranged under said mounting stage, said pattern is detected from the side of said pattern surface by said pattern detection device, and the coordinates of said pattern are measured by detecting the position of said XY stage when this pattern is detected.

4. A method for pattern coordinate measurement, comprising a steps of: mounting a substrate upon a pattern surface of which a pattern is formed upon an X stage with said pattern surface facing downwards; detecting said pattern from the side of said pattern surface by a pattern detection device which is provided upon a Y stage which is arranged under said X stage, and measuring the coordinates of said pattern by detecting the position of said X stage and the position of said Y stage when this pattern is detected by said pattern detection device.

5. A method for pattern coordinate measurement, comprising steps of mounting a transparent substrate upon a pattern surface of which a pattern is formed upon an XY stage with said pattern surface facing downwards;

detecting said pattern from an another surface of said substrate opposite to said pattern surface by a pattern detection device which is arranged above said XY stage; and measuring the coordinates of said pattern by detecting the position of said XY stage when this pattern is detected by said pattern detection device.

6. A method for pattern coordinate measurement according to claim 5, wherein the length of the optical path between said pattern surface of said substrate and said pattern detection device is compensated by a compensation optical system.

7. A method for pattern coordinate measurement according to claim 6, wherein said compensation optical system comprises a compensation element which compensates for aberration of said substrate according to the thickness of said substrate.

8. A device for pattern coordinate measurement, comprising:

an XY stage on which a transparent substrate upon a surface of which a pattern is formed is mounted with said pattern surface facing downwards;

a pattern detection device which is arranged under said XY stage, and which detects said pattern from the side of said pattern surface; and a position detection device which detects the position of said XY stage;

wherein the coordinates of said pattern are measured by detecting the position of said XY stage by said position detection device when said pattern is detected by said pattern detection device.

9. A device for pattern coordinate measurement, comprising:

a mounting stage on which a transparent substrate upon a surface of which a pattern is formed is mounted with said pattern surface facing downwards;

an XY stage which is provided under said mounting stage;

a pattern detection device which is arranged upon said XY stage, and which detects said pattern from the side of said pattern surface; and a position detection device which detects the position of said XY stage;

wherein the coordinates of said pattern are measured by detecting the position of said XY stage by said position detection device when said pattern is detected by said pattern detection device.

10. A device for measuring pattern coordinates, comprising:

an XY stage on which a transparent substrate upon a surface of which a pattern is formed is mounted with said pattern surface facing downwards;

a pattern detection device which is arranged above said XY stage, and which detects said pattern from the side of said substrate opposite to the side of said pattern surface;

a position detection device which detects the position of said XY stage; and a compensation optical system which is arranged between said XY stage and said pattern detection device, and which performs compensation so as to make the length of the optical path from said pattern surface to said pattern detection device become substantially equal, independently of the thickness of said substrate;

wherein the coordinates of said pattern are measured by detecting the position of said XY stage by said position detection device when said pattern is detected by said pattern detection device.

11. A device for pattern coordinate measurement according to claim 10, wherein said compensation optical system comprises a compensation element which compensates for aberration of said substrate according to the thickness of said substrate.

12. A method for measuring coordinate of a pattern formed or a pattern surface of a substrate which is mounted on a mounting stage, comprising steps of:

mounting said substrate on said mounting stage with said pattern surface facing in the same direction as when said substrate is mounted on an exposure device detecting said pattern by a pattern detection device; and measuring the coordinate of said pattern on the basis of a result of detecting of said pattern.

13. A device for pattern coordinate measurement, comprising:

an XY stage on which a transparent substrate upon a surface of which a pattern is formed is mounted, the orientation of said transparent substrate is the same as the orientation thereof when it is mounted to an exposure device;

a pattern detection device which is arranged under said XY stage, and which detects said pattern from the side of said pattern surface; and a position detection device which detects the position of said XY stage;

wherein the coordinates of said pattern are measured by detecting the position of said XY stage by said position detection device when said pattern is detected by said pattern detection device.

14. A method for pattern coordinate measurement according to claim 1, wherein said downwards direction is the same direction that said pattern surface faces when said substrate is mounted on an exposure device.

15. A method for pattern coordinate measurement according to claim 14, wherein said mounting stage is an XY stage, said pattern is detected from the side of said pattern surface by said pattern detection device which is arranged under said XY stage, and the coordinates of said pattern are measured by detecting the position of said XY stage when this pattern is detected.

16. A method for pattern coordinate measurement according to claim 14, wherein said pattern detection device is arranged upon an XY stage which is arranged under said mounting stage, said pattern is detected from the side of said pattern surface by said pattern detection device, and the coordinates of said pattern are measured by detecting the position of said XY stage when this pattern is detected.

17. A method for pattern coordinate measurement according to claim 4, wherein said downwards direction is the same direction that said pattern surface faces when said substrate is mounted on an exposure device.

18. A method for pattern coordinate measurement according to claim 5, wherein said downwards direction is the same direction that said pattern surface faces when said substrate is mounted on an exposure device.

19. A method for pattern coordinate measurement according to claim 18, wherein the length of the optical path between said pattern surface of said substrate and said pattern detection device is compensated by a compensation optical system.

20. A method for pattern coordinate measurement according to claim 19, wherein said compensation optical system comprises a compensation element which compensates for aberration of said substrate according to the thickness of said substrate.

21. A device for pattern coordinate measurement according to claim 8, wherein said downwards direction is the same direction that said pattern surface faces when said substrate is mounted on an exposure device.

22. A device for pattern coordinate measurement according to claim 9, wherein said downwards direction is the same direction that said pattern surface faces when said substrate is mounted on an exposure device.

23. A device for pattern coordinate measurement according to claim 10, wherein said downwards direction is the same direction that said pattern surface faces when said substrate is mounted on an exposure device.

24. A device for pattern coordinate measurement according to claim 23, wherein said compensation optical system comprises a compensation element which compensates for aberration of said substrate according to the thickness of said substrate.

* * * * *